(12) United States Patent
Daubenspeck et al.

(10) Patent No.: US 9,059,106 B2
(45) Date of Patent: Jun. 16, 2015

(54) COMPENSATING FOR WARPAGE OF A FLIP CHIP PACKAGE BY VARYING HEIGHTS OF A REDISTRIBUTION LAYER ON AN INTEGRATED CIRCUIT CHIP

(71) Applicant: International Business Machines Corporation, Armonk, NY (US)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/664,812

(22) Filed: Oct. 31, 2012

(65) Prior Publication Data
US 2014/0117535 A1    May 1, 2014

(51) Int. Cl.
*H01L 23/31* (2006.01)
*H01L 23/00* (2006.01)
*H01L 23/525* (2006.01)

(52) U.S. Cl.
CPC .......... *H01L 23/3114* (2013.01); *H01L 23/525* (2013.01); *H01L 24/13* (2013.01); *H01L 24/14* (2013.01); *H01L 2224/16225* (2013.01); *H01L 2924/15174* (2013.01); *H01L 2924/15311* (2013.01); *H01L 23/562* (2013.01); *H01L 2224/05569* (2013.01); *H01L 2224/024* (2013.01); *H01L 2224/0236* (2013.01);
(Continued)

(58) Field of Classification Search
None
See application file for complete search history.

(56) References Cited

U.S. PATENT DOCUMENTS

| 5,811,317 A | 9/1998 | Maheshwari et al. |
| 5,903,058 A * | 5/1999 | Akram ........................ 257/778 |

(Continued)

FOREIGN PATENT DOCUMENTS

| JP | 2009054741 | 3/2009 |
| KR | 10-1071761 | 10/2011 |
| WO | WO 2011/102100 A1 | 8/2011 |

OTHER PUBLICATIONS

Yadav, et al., "Reliabilty Evaluation on Low k Wafer Level Packages," 2011 Electronic Components and Technology Conference, 2011, pp. 71-77.

(Continued)

*Primary Examiner* — Steven Loke
*Assistant Examiner* — Juanita B Rhodes
(74) *Attorney, Agent, or Firm* — Gibb & Riley, LLC; David A. Cain, Esq.

(57) ABSTRACT

Structures and methods of making a flip chip package that employ polyimide pads of varying heights at a radial distance from a center of an integrated circuit (IC) chip for a flip chip package. The polyimide pads may be formed under electrical connectors, which connect the IC chip to a chip carrier of the flip chip package, so that electrical connectors formed on polyimide pads of greater height are disposed at a greater radial distance from the center of the IC chip, while electrical connectors formed on polyimide pads of a lesser height are disposed more proximately to the center of the IC chip. Electrical connectors of a greater relative height to the IC chip's surface may compensate for a gap, produced by heat-induced warpage during the making of the flip chip package, that separates the electrical connectors on the IC chip from flip chip attaches on the chip carrier.

18 Claims, 9 Drawing Sheets

(52) U.S. Cl.
CPC ............ *H01L23/3192* (2013.01); *H01L 24/05* (2013.01); *H01L 24/06* (2013.01); *H01L 24/16* (2013.01); *H01L 2224/02331* (2013.01); *H01L 2224/02381* (2013.01); *H01L 2224/0239* (2013.01); *H01L 2224/0401* (2013.01); *H01L 2224/05573* (2013.01); *H01L 2224/05575* (2013.01); *H01L 2224/05618* (2013.01); *H01L 2224/05639* (2013.01); *H01L 2224/05644* (2013.01); *H01L 2224/05655* (2013.01); *H01L 2224/05671* (2013.01); *H01L 2224/06102* (2013.01); *H01L 2224/13147* (2013.01); *H01L 2924/3511* (2013.01); *H01L 2224/05572* (2013.01)

(56) References Cited

U.S. PATENT DOCUMENTS

| | | |
|---|---|---|
| 6,180,265 B1 | 1/2001 | Erickson |
| 6,650,016 B1 | 11/2003 | MacQuarrie et al. |
| 6,900,545 B1 | 5/2005 | Sebesta et al. |
| 6,956,292 B2 | 10/2005 | Fan et al. |
| 6,989,297 B2 | 1/2006 | Sebesta et al. |
| 7,098,076 B2 | 8/2006 | Liu |
| 7,671,436 B2 | 3/2010 | Amin et al. |
| 7,803,693 B2 | 9/2010 | Trezza |
| 7,939,922 B2 | 5/2011 | Zhou et al. |
| 8,152,048 B2 | 4/2012 | Zu |
| 2005/0179142 A1 | 8/2005 | Liu |
| 2005/0181544 A1* | 8/2005 | Haba et al. ............. 438/127 |
| 2005/0270045 A1* | 12/2005 | Akram ............. 324/754 |
| 2006/0258049 A1 | 11/2006 | Lee et al. |
| 2008/0012150 A1* | 1/2008 | Yang ............. 257/780 |
| 2008/0128885 A1* | 6/2008 | Lee et al. ............. 257/690 |
| 2010/0230812 A1* | 9/2010 | Oganesian et al. ............. 257/737 |
| 2011/0108982 A1 | 5/2011 | Kim et al. |
| 2011/0151627 A1 | 6/2011 | Graf et al. |
| 2011/0233771 A1 | 9/2011 | Kwon et al. |
| 2012/0085572 A1 | 4/2012 | Sakai |

OTHER PUBLICATIONS

Fan, et al., "Design and Reliability in Wafer Level Packaging," 2008 10th Electronics Packaging Technology Conference, 2008, pp. 834-841.

* cited by examiner

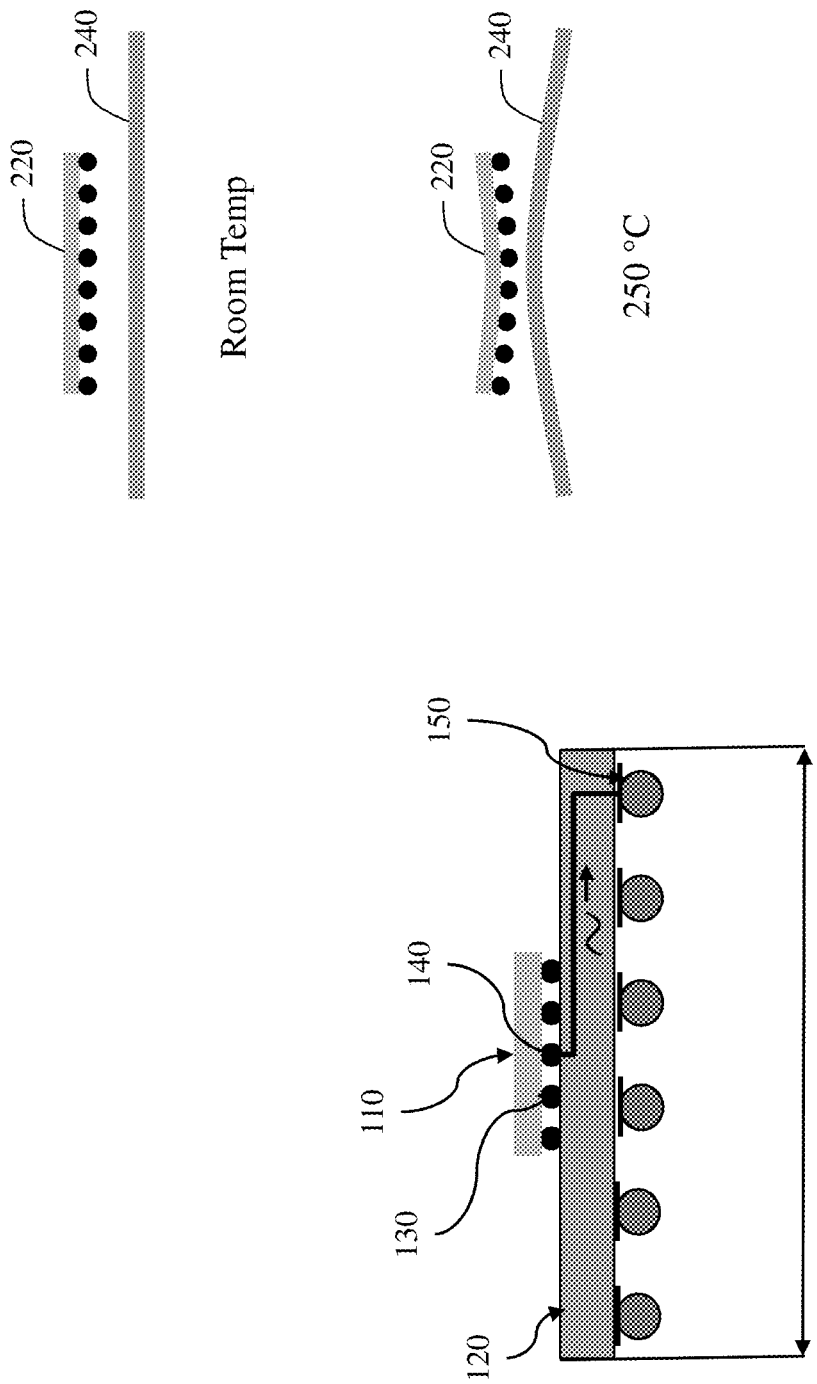

COMPENSATING FOR WARPAGE OF A FLIP CHIP PACKAGE BY VARYING HEIGHTS OF A REDISTRIBUTION LAYER ON AN INTEGRATED CIRCUIT CHIP

BACKGROUND

1. Field of the Invention

This disclosure generally relates to structures of a chip-side redistribution layer (RDL) and methods of making a chip-side RDL that employ polyimide pads of varying heights at a radial distance from a center of an integrated circuit (IC) chip for a flip chip package. The polyimide pads of varying heights may be formed under electrical connectors, which connect the IC chip to a chip carrier of the flip chip package, so that those electrical connectors formed on polyimide pads of a greater height are disposed at a greater radial distance from the center of the IC chip, i.e., on the IC chip's edges and corners, while electrical connectors formed on polyimide pads of a lesser height are disposed more proximately to the center of the IC chip. Electrical connectors of a greater relative height to the IC chip's surface may compensate for a gap, produced by warpage, that separates the electrical connectors on the IC chip from flip chip attaches on the chip carrier in the making of the flip chip package.

2. Description of Related Art

The semiconductor marketplace continues to demand smaller devices, which require greater connectivity densities for packaging design. The increased functionality of smaller semiconductor devices requires an increased number of signal, power, and ground connections, and a corresponding decrease in connection pitch is required to maintain reasonable chip size. The combination of these requirements results in greater complexity of semiconductor packaging design.

The packaging design requirement is especially critical in flip chip packages, where demand for a greater density of connections must coexist with good electrical and thermal reliability performance. When compared to other packaging technologies, a flip chip package, as shown in FIG. 1, significantly increases the number of signal, power and ground connections that connect an integrated circuit (IC) 110 chip to a chip carrier 120 through solder bumps or copper (Cu) pillars 130.

During the chip-join processes of packaging, the solder bumps or Cu pillars 130 form electrical connections to the flip chip (FC) attaches 140 on the chip carrier 120. The solder bumps or Cu pillars 130 are formed on underlying under-bumps or ball limiting metallurgy (BLM) structures that are formed on the IC chip 110. Joining of the IC chip 110 to the chip carrier 120 requires heating of the solder bumps or Cu pillars 130, so as to "wet" the opposing solder surfaces of the solder bumps or Cu pillars 130 and the solder of the FC attaches 140. This wetting allows the opposing miscible solders to form an effective electrical connection. An electrical signal, power or ground travels from the FC attach 140 through the chip carrier 120 to a ball grid array land 150 for further packaging structures.

During the first phase of packaging, the flip chip-join of the solder bumps or Cu pillars is adversely affected by warpage, which varies as a function of temperature. At elevated temperatures, both the IC chip and the chip carrier warp because of mismatches between the coefficients of thermal expansion (CTE) of their constituent layers. Relative to room temperature, as shown in the cross sections of FIG. 2, the IC chip 220 at an elevated temperature of approximately 250° C. shows a slight negative warp, i.e., the IC chip's center is lower than the corners; whereas, the chip carrier 240 shows a positive warp, i.e., the chip carrier's center is higher than its corners. The relatively more compliant chip carrier typically warps to a greater extent than does the IC chip. Warping represents a change in height of sub-areas across the surface area of either the IC chip or the chip carrier at an elevated temperature relative to a reference plane at room temperature.

The extent of warping of the IC chip and the chip carrier is proportional to a radial distance from a centrally located neutral point, i.e., DNP, of each of the IC chip and the chip carrier. Hence, the relative distance between the opposing solders on the IC chip and the chip carrier is greatest at the greatest radial distances from the DNPs, i.e., above the edges and corners of the IC chip. At peak elevated temperatures, the solder bumps or Cu pillars above the edges and corners of the IC chip, and the solder of the opposing FC attaches are physically separated and contact is impossible.

Experiments indicate that warpage above the edges and corners of the IC chip results in gaps of 10 or more microns between the surfaces of the solder bumps or Cu pillars and their corresponding FC attaches in a flip chip package. Such a gap results in a warpage-related "nonwet" problem, where the opposing miscible solders cannot mix.

The mechanical stresses and strains that occur with chip package interactions (CPIs) are complex, depending upon many factors including IC chip design, chip carrier design, process variations in IC chip and chip carrier manufacture, and process variations in bond and assembly. Many CPIs result from stress/strain caused by a mismatch between the coefficients of thermal expansion (CTE) of the IC chip and the chip carrier during the processes of heating the solder of the solder bumps or CU pillars to their melting point and the subsequent cooling of the joined IC chip and chip carrier to an ambient temperature. Differences in contraction during cool-down result in shear forces between the IC chip and the chip carrier. These shear forces are usually propagated as stress/strain through the solder bumps or Cu pillars to an interface region with the IC chip.

One type of chip package interaction (CPI) is a so-called "white bump" because of the white area produced on photographically processed acoustic images during test of the flip chip package. Each white bump corresponds to the location of a material fracture or layer separation in the region below the solder bump or Cu pillar and within the IC chip-level circuitry. Frequently, the white bump resembles a divot formed beneath a solder bump or Cu pillar in the back-end-of-line (BEOL) layers of the IC chip. White bumps typically occur at the IC chip's edges and corners, where shear forces resulting from warpage are greatest. In addition, a white bump is usually located on the compressive peripheral edge of the solder bump or Cu pillar, which is subject to a radially-directed tensile stress during cool-down.

Redistribution layers (RDLs) are widely used in modern IC chip-side technology to re-orient a final BEOL-level wiring pattern for compatibility with different packaging options. Referring to FIG. 3, a standard RDL structure typically makes use of a first continuous polyimide layer 310 between the final BEOL layer 320 of the IC chip and the RDL wiring/pad layer 330, to "cushion" or mitigate mechanical stress. A second continuous polyimide layer 340 is used as a final passivating layer. However, fabrication of an RDL structure with two full-thickness continuous polyimide layers, each of approximately 10 μm thickness, subsequently gives rise to unacceptable levels of IC chip-side warpage from polyimide tensile stresses during flip chip packaging. In a worst case, these polyimide tensile stresses preclude wafer or chip-level processing beyond the polyimide curing process.

It is known that polyimide formed into discrete "island" structures can enable local reduction of CPI stresses without creating the unacceptable warpage of a continuous layer's application.

There remains a need to compensate for the gap produced by warpage and chip package interactions (CPIs), including "white bumps", in the making of flip chip packages by using a chip-side redistribution layer (RDL) that includes polyimide.

SUMMARY OF INVENTION

In view of the foregoing, an exemplary embodiment of the disclosure may provide a flip chip package that comprises an integrated circuit (IC) chip that includes a passivation layer, which contains a plurality of openings to an inner final wiring level. The flip chip package may also comprise a plurality of polyimide (PI) pads disposed on the passivation layer, each PI pad corresponding to a single opening in the passivation layer and having a variable pad height that increases with a radial distance from a central neutral point (DNP) on the IC chip. The flip chip package may further comprise a redistribution layer (RDL) disposed on the passivation layer and the PI pads, the RDL including a plurality of conductive traces, each conductive trace extending from a lower surface contact proximate to the final wiring level through the single opening to an upper surface contact that overlies a single PI pad. The flip chip package may yet further comprise a plurality of electrical connectors, each electrical connector being of a same height and being disposed over the upper surface contact of the each conductive trace. Finally, the flip chip package may include a chip carrier including a plurality of flip chip attaches, each flip chip attach having a solder join to a corresponding one of the plurality of electrical connectors on a flipped IC chip.

Another exemplary embodiment of the disclosure may provide a method of making a flip chip package that comprises forming a plurality of first polyimide (PI) pads, each having a first pad height, on an edge region of a passivation layer of an integrated circuit (IC) chip, each first PI pad being associated with one of a first plurality of openings in the passivation layer to an inner final wiring level of the IC chip. The method may also comprise forming a second plurality of second PI pads, each having a second pad height, a second PI pad from a portion of the second PI pads being stacked on each of the first PI pads to form a stacked pad equal to the first pad height plus the second pad height in the edge region, a second PI pad from another portion of the second PI pads being formed on a mid-radial region of the passivation layer and being associated with one of a second plurality of openings in the passivation layer to the final wiring level. The method may further comprise forming a redistribution layer (RDL) that includes a plurality of conductive traces, each conductive trace extending from a lower surface contact proximate to the final wiring level through one of the first plurality, the second plurality, and a third plurality of openings in the passivation layer to an upper surface contact disposed above one of the second PI pads disposed atop each stacked pad in the edge region, one of the second PI pads in the mid-radial region, and the passivation layer in a central region which is devoid of first and second PI pads. The method may yet further comprise forming a plurality of electrical connectors, each electrical connector being of a same height and being disposed over the upper surface contact of each conductive trace. The method may yet further comprise flipping the IC chip, on which the RDL and the electrical connectors are formed. Finally, the method may comprise heating solder joins between the electrical connectors, which are disposed on a warped flipped IC chip, and flip chip attaches, which are disposed on a warped chip carrier, to form the flip chip package.

Yet another exemplary embodiment of the disclosure may provide a method of making a flip chip package that comprises forming a plurality of first polyimide (PI) pads on a passivation layer of an integrated circuit (IC) chip, each of the first PI pads having a first pad height, each of a portion of the first PI pads being formed on an edge region of the passivation layer and being associated with one of a first plurality of openings in the passivation layer to an inner final wiring level of the IC chip, each of another portion of the first PI pads being formed on a mid-radial region of the passivation layer and being associated with one of a second plurality of openings in the passivation layer to the final wiring level. The method may also comprise forming a second plurality of second PI pads, each having a second pad height, on each of the first PI pads in the edge region to form a stacked pad equal to the first pad height and the second pad height. The method may further comprise forming a redistribution layer (RDL) that includes a plurality of conductive traces, each conductive trace extending from a lower surface contact proximate to the final wiring level through one of the first plurality, the second plurality, and a third plurality of openings in the passivation layer to an upper surface contact disposed above one of the second PI pads disposed atop each stacked pad in the edge region, one of the first PI pads in the mid-radial region, and the passivation layer in a central region, which is devoid of first and second PI pads. The method may yet further comprise forming a plurality of electrical connectors, each electrical connector being of a same height and being disposed over the upper surface contact of the each conductive trace. The method may yet further comprise flipping the IC chip, on which the RDL and the electrical connectors are formed. Finally, the method may comprise heating solder joins between the electrical connectors, which are disposed on a warped flipped IC chip, and flip chip attaches, which are disposed on a warped chip carrier, to form the flip chip package.

Yet another exemplary embodiment of the disclosure may provide a method of making a flip chip package that comprises forming, with a patterned and continuously-varying radial half-tone mask, a plurality of polyimide (PI) pads on a passivation layer of an integrated circuit (IC) chip, each of the PI pads being associated with one of a plurality of openings in a passivation layer to an inner wiring level in the IC chip, each of the PI pads' heights being determined by an exposure through the patterned and continuously-varying radial half-tone mask and being correlated with a radial distance from a central neutral point on the IC chip. The method may also comprise forming a redistribution layer (RDL) over the PI pads, the RDL containing a plurality of conductive traces, each conductive trace extending from a lower surface contact proximate to the final wiring level through one opening of the plurality of openings in the passivation layer to an upper surface contact that overlies one of the PI pads. The method may further comprise forming a plurality of electrical connectors, each electrical connector being of a same height and being disposed over the upper surface contact of each conductive trace. The method may yet further comprise flipping the IC chip, on which the RDL and the electrical connectors are formed. Finally, the method may comprise heating solder joins between the electrical connectors, which are disposed on a warped flipped IC chip, and flip chip attaches, which are disposed on a warped chip carrier, to form the flip chip package.

BRIEF DESCRIPTION OF THE DRAWINGS

The exemplary embodiments of the disclosures herein will be better understood from the following detailed description with reference to the drawings, which are not necessarily drawn to scale and in which:

FIG. 1 is a schematic diagram illustrating a cross section of a flip chip package in the related art;

FIG. 2 is a schematic diagram illustrating cross sections of a "flipped" IC chip and a chip carrier of a flip chip package at room temperature, which shows no warping, and of the "flipped" IC chip showing a slight negative warp at an elevated temperature, while the chip carrier of the flip chip package shows a positive warp at an elevated temperature in the related art;

DETAILED DESCRIPTION

Figure 3:
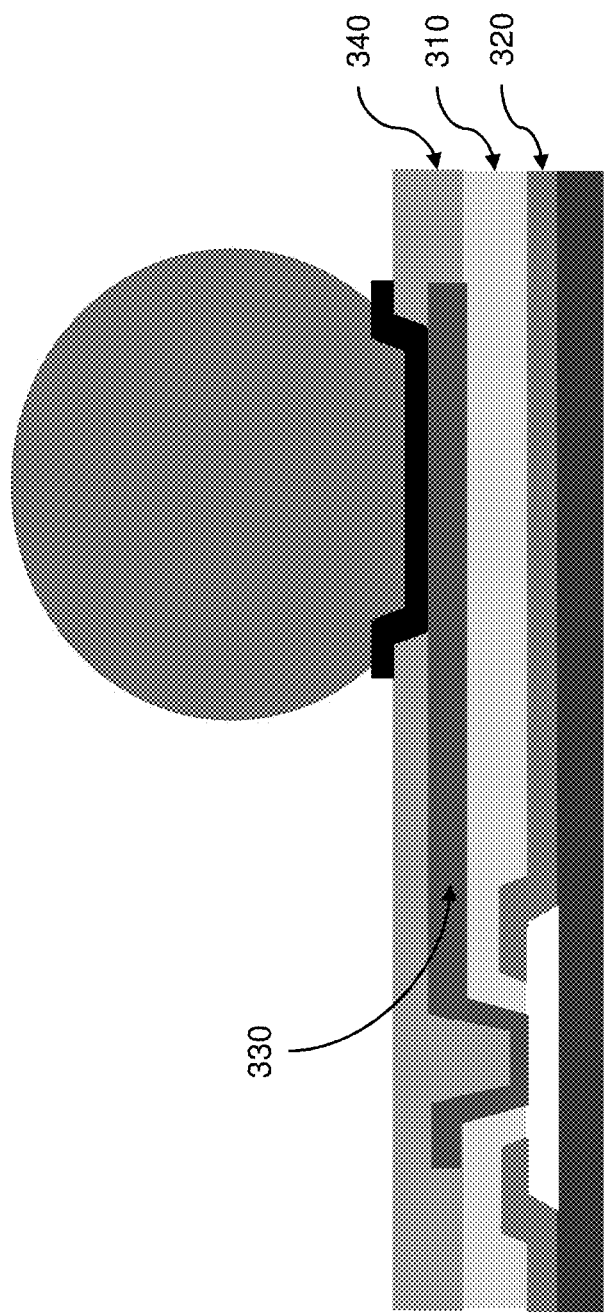
FIG. 3 is a schematic diagram illustrating a cross section of an IC chip and a redistribution layer (RDL) with two full thickness polyimide layers the in the related art.

The exemplary embodiments of the disclosure and their various features and advantageous details are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the disclosure. The examples used herein are intended to merely facilitate an understanding of ways in which the exemplary embodiments of the disclosure may be practiced and to further enable those of skill in the art to practice the exemplary embodiments of the disclosure. Accordingly, the examples should not be construed as limiting the scope of the exemplary embodiments of the disclosure.

As described above, there remains a need to compensate for the gap produced by warpage and chip package interactions (CPIs), including "white bumps", in the making of flip chip packages by using a chip-side redistribution layer (RDL) that includes polyimide.

Various exemplary embodiments of the invention may form a chip-side redistribution layer (RDL) that overlies polyimide pads of varying heights above the integrated circuit (IC) chip of a flip chip package. The polyimide pads of varying heights may be formed under electrical connectors, which connect the IC chip to a chip carrier of the flip chip package, so that those electrical connectors formed on polyimide pads of a greater height are disposed at a greater radial distance from the center of the IC chip, i.e., on the IC chip's edges and corners, while electrical connectors formed on polyimide pads of a lesser height are disposed more proximately to the center of the IC chip. Electrical connectors of a greater relative height to the IC chip's surface may compensate for a gap, produced by warpage during heating, that may separate the electrical connectors on the IC chip from flip chip attaches on the chip carrier in the making of the flip chip package. Compensating for warpage may allow "wetting" between the electrical connectors, comprising one of solder bumps and copper (Cu) pillars, and the FC attaches of the chip carrier, and may reduce the probability of forming "white bumps", by virtue of the stress-mitigating properties of the polyimide pads. The separate polyimide pads, underlying each of the electrical connectors, may not produce the unacceptable tensile forces associated with heating a continuous full thickness polyimide layer that produces warpage of the IC chip. Each of the separate polyimide pads may "cushion" or mitigate mechanical stresses between each of the overlying electrical connectors of varying heights formed on the IC chip and its corresponding flip chip attach on the chip carrier during chip-join and cool-down in the making of the flip chip package.

Figure 4:
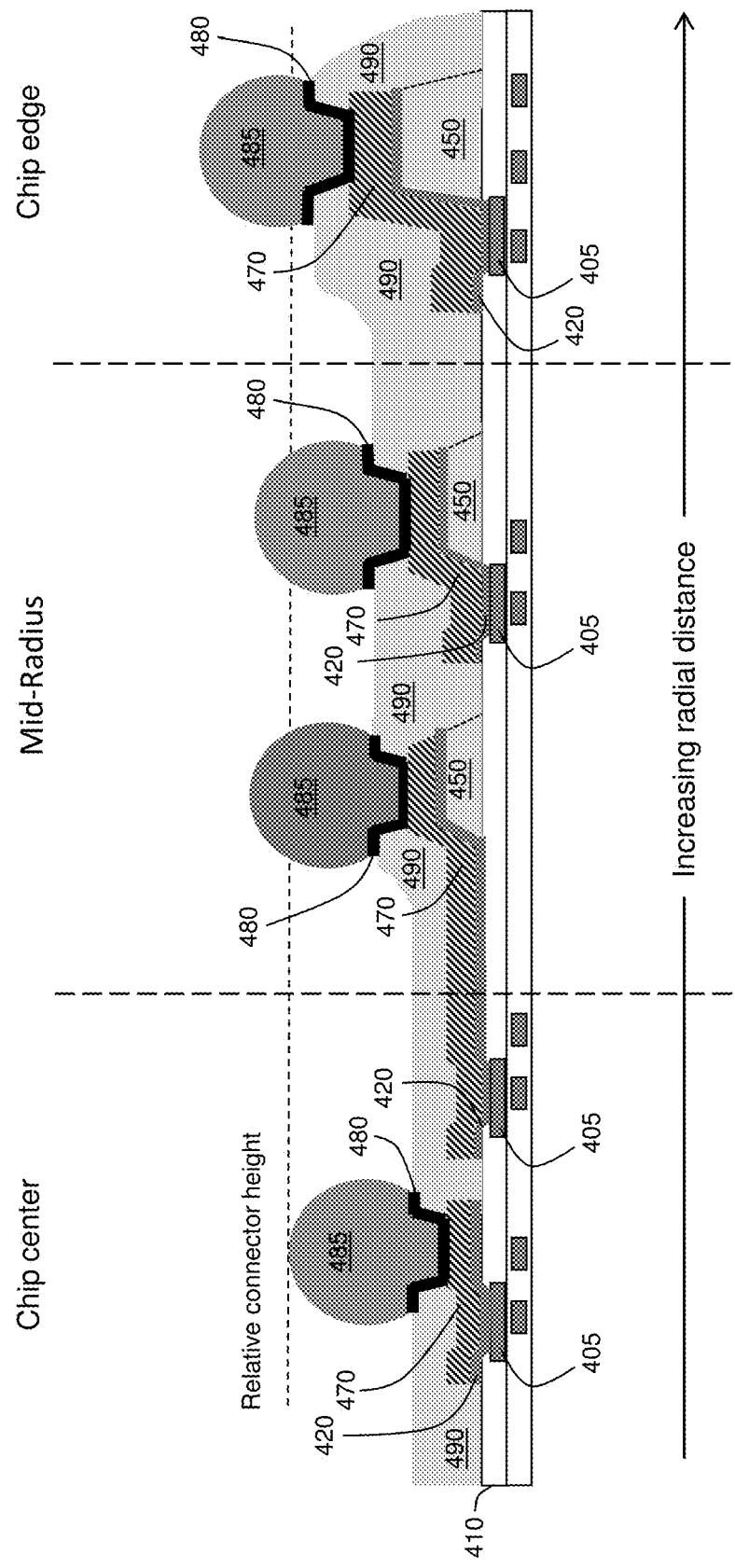
FIG. 4 illustrates a schematic cross section of an IC chip, a chip-side RDL and electrical connectors disposed on the RDL, where the relative height of the electrical connectors is positively correlated with a radial length from a central neutral point of the IC chip and a connective trace that is proximate to the final wiring level in the central region of the chip extends to a polyimide pad located in, for example, a mid-radial region of the chip in an exemplary embodiment.

FIG. 4 illustrates a schematic cross section of a portion of a flip chip package comprising an IC chip, a chip-side redistribution layer (RDL), and electrical connectors 485, which may be disposed on the RDL in an exemplary embodiment. Polyimide pads 450 of varying heights may be formed under electrical connectors 485, which connect the IC chip to a chip carrier of the flip chip package, so that those electrical connectors 485 formed on polyimide pads 450 of a greater height are disposed at a greater radial distance from the center of the IC chip, i.e., on the IC chip's edges and corners, while electrical connectors 485 formed on polyimide pads 450 of a lesser height are disposed more proximately to the center of the IC chip. The radial distance from the central neutral point may delineate three regions of the IC chip including an edge region that centripetally extends from edges and corners of the IC chip to an inner radius, $R_2$, a central region that centrifugally extends from the central point to a radius, $R_1$, where $R_1 < R_2$, and a mid-radial region interposed between the central region and the edge region. The central neutral point of the IC chip may be an unmoving reference point, about which other points on the surface of the IC chip may warp during heating.

Referring to FIG. 4, the IC chip of a flip chip package may include a passivation layer 410 that contains a plurality of openings to an inner wiring level 405 of the IC chip. Individual openings through the passivation layer 410 may be disposed in any region of the IC chip, e.g., the central region, the mid-radial region, and the edge region, to an underlying portion of the final wiring level 405 of the IC chip. The final passivation layer 410 may comprise any of an oxide and a nitride layer.

A plurality of polyimide pads 450 may be disposed on the passivation layer 410 of the IC chip. Each polyimide pad 450 may comprise one or more polyimide pads of various heights and may possess mechanical properties that "cushion" the underlying IC chip from mechanical forces produced by chip join processes in the making of the flip chip package. The plurality of polyimide pads 450 may comprise a photosensitive polyimide (PSPI) that may be patterned and deposited on the passivation layer 410. Each of the plurality of polyimide pads 450 may be separate one from the other, and thus, may avoid the unacceptable levels of IC chip-side warpage caused by tensile stresses from a continuous polyimide layer during flip chip packaging. Each of the polyimide pads 450 may correspond to a single opening through the passivation layer 410 and may have a pad height that is a function of the radial distance from the central point (DNP) of the IC chip, e.g., one of a continuously increasing function and a discontinuously increasing function.

A redistribution layer (RDL) may be disposed on the passivation layer 410 and the polyimide pads 450. The RDL may include a plurality of conductive traces 470 that re-distribute electrical signals or voltages from portions of the final wiring level 405 of the IC chip for compatibility with different packaging options, e.g., one of variously patterned chip carriers for a flip chip package. A conductive trace may extend from a lower surface contact proximate to a portion of the final wiring level 405 through a single opening in the passivation layer 410 to an upper surface contact that overlies one of the polyimide pads 450. In various exemplary embodiments, a conductive trace 470 may extend from a lower surface contact proximate to a portion of the final wiring level 405 in any of the central, mid-radial, and edge regions of the IC chip, through a single opening in the passivation layer 410, to be disposed on any of a polyimide pad 450 in the central region, a polyimide pad 450 in the mid-radial region, and a polyimide pad 450 in the edge region of the IC chip. Alternatively, the conductive trace 470 may extend through the single opening to be disposed on any of the passivation layer 410 in the central region, a polyimide pad 450 in the mid-radial region, and a polyimide pad 450 in the edge region of the IC chip.

A plurality of electrical connectors 485 may be disposed on the RDL. Each electrical connector of the plurality of electrical connectors 485 may be of a same height and may be disposed on the upper surface contact of one of the conductive traces 470. Each electrical connector 485 may comprise one of a solder bump and a copper (Cu) pillar.

Referring to FIG. 4, a relative connector height for each electrical connector 485 may be referenced from the surface of the final passivation layer 410 of the IC chip to a topmost height of the electrical connector 485. The relative connector height of the electrical connectors 485 may reflect the varying heights of the polyimide pads 450 that underlie each electrical connector 485. In an exemplary embodiment, polyimide pads 450 of a first pad height in the edge region of the IC chip may preferably range from 6 to 12 μm, polyimide pads 450 of a second pad height in the mid-radial region may preferably range from 3 to 8 μm, and polyimide pads 450 of a third pad height in the central region may preferably range from 1 to 4 μm. Alternatively, in another exemplary embodiment where no polyimide pads are disposed in the central region of the IC chip, polyimide pads 450 of a first pad height in the edge region of the IC chip may preferably range from 6 to 12 μm, and polyimide pads 450 of a second pad height in the mid-radial region may preferably range from 3 to 8 μm.

Figure 5:
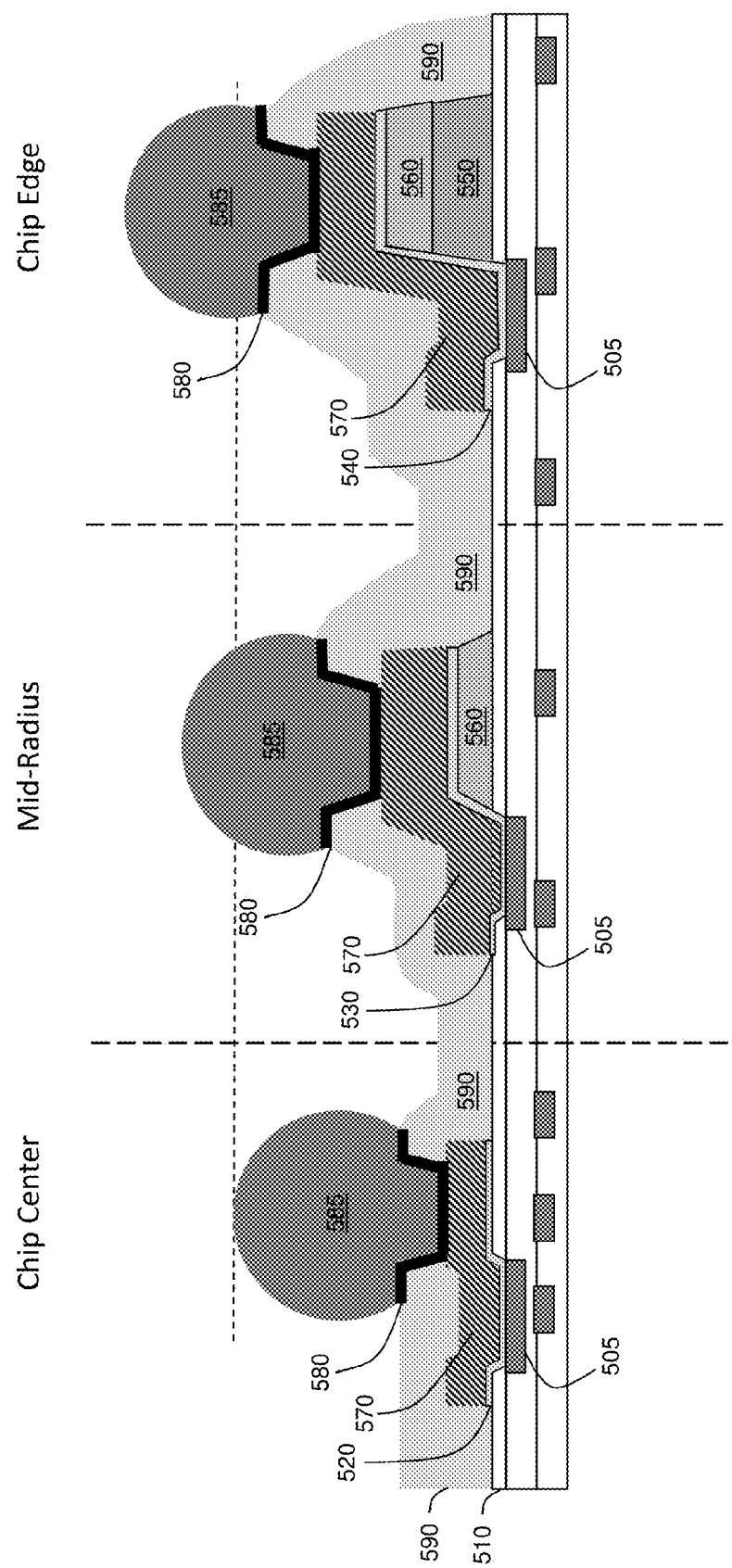
FIG. 5 illustrates a schematic cross section of an IC chip, a chip-side RDL and electrical connectors disposed on the RDL, in which polyimide pads of a varying height comprise one of: a second polyimide pad, and a second polyimide pad formed on a first polyimide pad, in a flip chip package of an exemplary embodiment.

FIG. 5 illustrates a schematic cross section of a portion of a flip chip package comprising an IC chip, a chip-side redistribution layer (RDL), and electrical connectors 585, where each of the polyimide pads formed on the IC chip may comprise one of: a second polyimide pad 560 formed in a mid-radial region, and a stacked pad comprising a second polyimide pad 560 stacked atop a first polyimide pad 550 in an edge region. A radial distance from a central neutral point of the IC chip may delineate three regions of the IC chip including: an edge region that centripetally extends from edges and corners of the IC chip to an inner radius, $R_2$, a central region that centrifugally extends from the central point to a radius, $R_1$, where $R_1 < R_2$, and a mid-radial region interposed between the central region and the edge region.

Referring to FIG. 5, a method of making the portion of the flip chip package comprising the IC chip, the RDL, and the electrical connectors 585 may include forming a plurality of first polyimide (PI) pads 550 on an edge region of a passivation layer 510 of an integrated circuit (IC) chip. The plurality of first polyimide pads 550 may comprise a photosensitive polyimide (PSPI) that may be patterned and deposited on the passivation layer 510. Each of the first polyimide pads 550 may have a first pad height and may be being associated with one of a first plurality of openings in the passivation layer 510 to an inner final wiring level 505 of the IC chip. The method may also include forming a second plurality of second polyimide pads 560 on the IC chip, each of the second polyimide pads 560 having a second pad height. The second plurality of second polyimide pads 560 may also comprise a photosensitive polyimide (PSPI) that may be patterned and deposited on the passivation layer 510. A single second polyimide pad from a portion of the second plurality of second polyimide pads 560 may be stacked atop each of the first polyimide pads 550, in the edge region, to form a stacked pad having a height equal to the first pad height plus the second pad height in an exemplary embodiment. A single second polyimide pad from another portion of the second plurality of second polyimide pads 560 may be formed on the mid-radial region of the passivation layer 510 and may be associated with one of a second plurality of openings in the passivation layer 510 to the final wiring level 505.

Each of the single second polyimide pads 560 in the mid-radial region and the stacked pads in the edge region may possess mechanical properties that "cushion" the underlying IC chip from mechanical forces produced by chip join processes in the making of the flip chip package. Each of the single second polyimide pads 560 in the mid-radial region and the stacked pads in the edge region may be separate one from the other, and thus, may avoid the unacceptable levels of IC chip-side warpage caused by heat-induced tensile stresses from a continuous polyimide layer during flip chip packaging.

The method of making of making the portion of the flip chip package comprising the RDL may include forming the RDL on the passivation layer 510 and the second polyimide pads 560. The RDL may include a plurality of conductive traces 570 that re-distribute electrical signals or voltages from portions of the final wiring level 505 of the IC chip for compatibility with different packaging options, e.g., one of variously patterned chip carriers for a flip chip package. Each conductive trace 570 may comprise a metal, e.g., aluminum (Al). Each conductive trace may extend from a lower surface contact proximate to a portion of the final wiring level 505 through a one of: the first plurality of openings in the edge region of the passivation layer 510, the second plurality of openings in the mid-radial region of the passivation layer 510, and a third plurality of openings in a central region of the passivation layer 510, to an upper surface contact. In various exemplary embodiments, each conductive trace 570 may extend from the lower surface contact proximate to a portion of the final wiring level 505 in any of the central, mid-radial, and edge regions of the IC chip, through a single opening in the passivation layer 510, to be disposed on any of: the passivation layer 510 in the central region, a second polyimide pad 560 in the mid-radial region, and a second polyimide pad 560 disposed atop a first polyimide pad 550 in the edge region of the IC chip.

Referring to FIG. 5, the method of making of making the portion of the flip chip package comprising a plurality of electrical connectors 585 may include forming electrical connectors 585 above the second polyimide pads 560 in the mid-radial region and the second polyimide pads 560 stacked on the first polyimide pads 550 in the edge region that are covered by the RDL. Each electrical connector of the plurality of electrical connectors 585 may be of a same height and may be disposed on the upper surface contact of one of the conductive traces 570. Each electrical connector 585 may comprise one of a solder bump and a copper (Cu) pillar. A relative height of each electrical connector 585 may be equal to the first pad height of a first polyimide pad 550 plus the second pad height of a second polyimide pad 560 for each stacked pad underlying each electrical connector 585 in the edge region, and may be equal to the second pad height for each second polyimide pad 560 underlying each electrical connector 585 in the mid-radial region of the IC chip.

The method of making the flip chip package comprising the IC chip, the RDL, and the electrical connectors 585 may include flipping the IC chip, on which the RDL and the electrical connectors 585 are formed, and heating solder joins between the electrical connectors 585, which are disposed on a warped flipped IC chip, and flip chip attaches, which are disposed on a warped chip carrier, to form the flip chip package (See FIGS. 1, 2 and 5).

The method of forming the RDL may also include forming a plurality of conductive liners, 520, 530, 540 in the central, mid-radial and edge regions, respectively. Each conductive liner may contact the final wiring level 510 through one of the first, second, and third pluralities of openings in passivation layer 510, and may extend to the upper surface contact under each conductive trace 570. Each conductive line may comprise a metal or metal alloy including any of titanium (Ti), tungsten (W), tantalum (Ta), nickel (Ni), chromium (Cr), zinc (Zn), silver, (Ag), and gold (Au).

The method of making the flip chip package comprising the RDL may further include forming a final polyimide passivation layer 590 on the RDL of the IC chip before the forming of the electrical connectors 585, and subsequently etching the final polyimide passivation layer 590 to form a plurality of openings that expose the upper surface contacts of each of the conductive traces 570. After the etching of the openings in the final passivation layer 590 and before the forming of the plurality of electrical connectors 585, a plurality of ball limiting metallurgy (BLM) structures may be formed on the upper surface contacts exposed by the plurality of openings of the final polyimide passivation layer 590. Each of the BLM structures may comprise one of more layers, where any of the one or more layers may comprise a metal or metal ally including any of nickel (Ni), chromium (Cr), zinc (Zn), silver, (Ag), and gold (Au).

Figure 6:
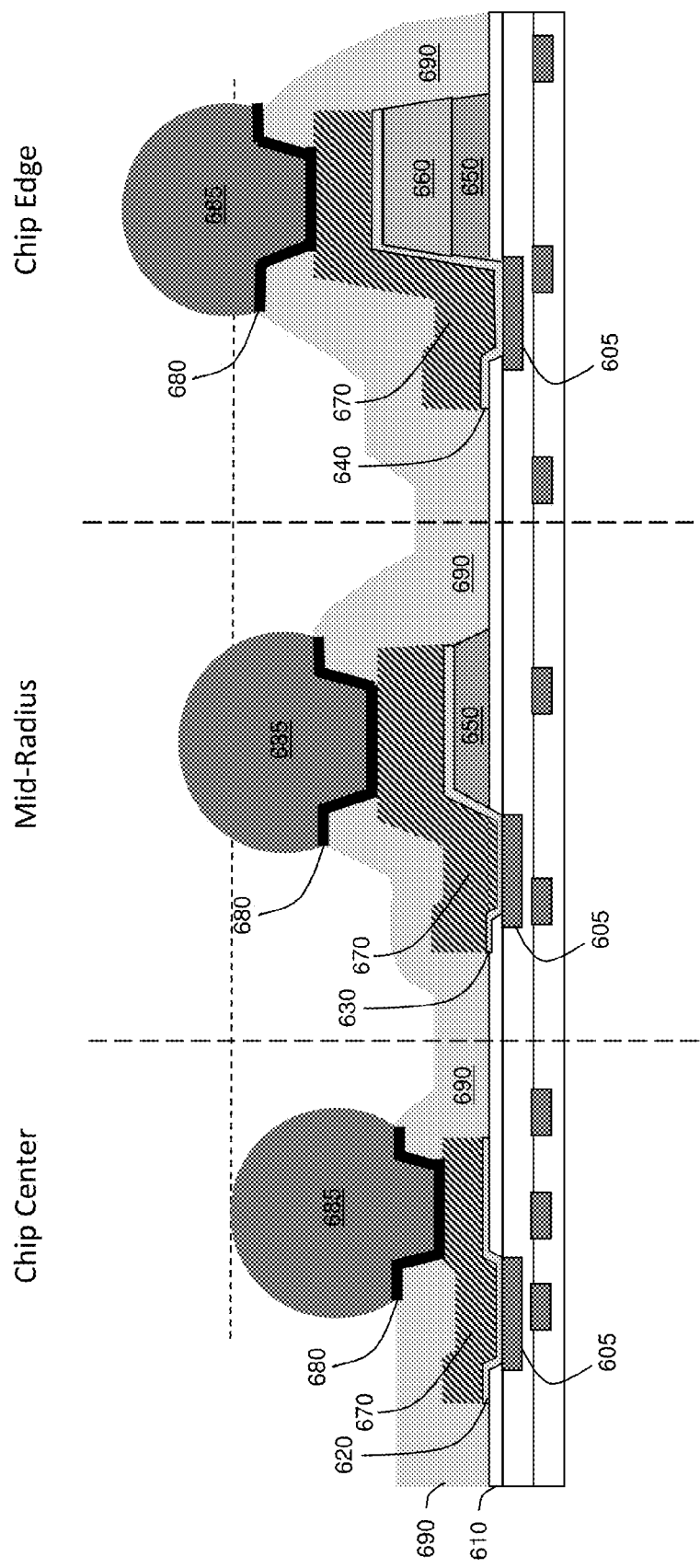
FIG. 6 illustrates a schematic cross section of an IC chip, a chip-side RDL and electrical connectors disposed on the RDL, in which polyimide pads of a varying height comprise one of: a first polyimide pad, and a second polyimide pad formed on a first polyimide pad, in a flip chip package of an exemplary embodiment.

FIG. 6 illustrates a schematic cross section of a portion of a flip chip package comprising an IC chip, a chip-side redistribution layer (RDL), and electrical connectors 685, where each of the polyimide pads formed on the IC chip may comprise one of: a first polyimide pad 650 formed in a mid-radial region, and a stacked pad comprising a second polyimide pad 660 stacked atop a first polyimide pad 650 in an edge region. A radial distance from a central neutral point of the IC chip may delineate three regions of the IC chip including: an edge region that centripetally extends from edges and corners of the IC chip to an inner radius, $R_2$, a central region that centrifugally extends from the central point to a radius, $R_1$, where $R_1 < R_2$, and a mid-radial region interposed between the central region and the edge region.

Referring to FIG. 6, a method of making the portion of the flip chip package comprising the IC chip, the RDL, and the electrical connectors 685 may include forming a plurality of first polyimide (PI) pads 650 on a passivation layer 610 of an integrated circuit (IC) chip, where each of the first polyimide pads 650 may have a first pad height. The plurality of first polyimide pads 650 may comprise a photosensitive polyimide (PSPI) that may be patterned and deposited on the passivation layer 610. Each of a portion of the first polyimide pads 650 may be formed on an edge region of the passivation layer 610 and may be associated with one of a first plurality of openings in the passivation layer 610 to an inner final wiring level 650 of the IC chip. Each of another portion of the first polyimide pads 650 may be formed on a mid-radial region of the passivation layer 610 and may be associated with one of a second plurality of openings in the passivation layer 610 to the final wiring level 605. The method may also include forming a second plurality of second polyimide pads 660, each having a second pad height, on each of the first polyimide pads 650 in the edge region to form a stacked pad equal to the first pad height and the second pad height. The second plurality of second polyimide pads 660 may also comprise a photosensitive polyimide (PSPI) that may be patterned and deposited on the passivation layer 610.

Each of the first polyimide pads 650 in the mid-radial region and the stacked pads in the edge region may possess mechanical properties that "cushion" the underlying IC chip from mechanical forces produced by chip join processes in the making of the flip chip package. Each of the first polyimide pads 650 in the mid-radial region and the stacked pads in the edge region may be separate one from the other, and thus, may avoid the unacceptable levels of IC chip-side warpage caused by heat-induced tensile stresses from a continuous polyimide layer during flip chip packaging.

The method of making of making the portion of the flip chip package comprising the RDL may include forming the RDL on the passivation layer 610, the first polyimide pads 650 in the mid-radial region, and the second polyimide pads 660, which are stacked atop the first polyimide pads 650 in the edge region. The RDL may include a plurality of conductive traces 670 that re-distribute electrical signals or voltages from portions of the final wiring level 605 of the IC chip for compatibility with different packaging options, e.g., one of variously patterned chip carriers for a flip chip package. Each conductive trace 670 may comprise a metal, e.g., aluminum (Al). Each conductive trace may extend from a lower surface contact proximate to a portion of the final wiring level 605 through a one of: the first plurality of openings in the edge region of the passivation layer 610, the second plurality of openings in the mid-radial region of the passivation layer 610, and a third plurality of openings in a central region of the passivation layer 610, to an upper surface contact formed above one of: a second polyimide pad 660 disposed atop each stacked pad in the edge region, a second polyimide pad 660 in the mid-radial region, and the passivation layer 610 in a central region, which is devoid of the first polyimide pads 650 and the second polyimide pads 660. In various exemplary embodiments, each conductive trace 670 may extend from the lower surface contact proximate to a portion of the final wiring level 605 in any of the central, mid-radial, and edge regions of the IC chip, through a single opening in the passivation layer 610, to be disposed on any of: the passivation layer 610 in the central region, a first polyimide pad 650 in the mid-radial region, and a second polyimide pad 660 disposed atop a first polyimide pad 650 in the edge region of the IC chip.

Each of the second polyimide pads 660 that are stacked on the first polyimide pads 650 in the edge region may possess mechanical properties that "cushion" the underlying IC chip from mechanical forces produced by chip join processes in the making of the flip chip package. Each of the second polyimide pads 650 that are stacked on the first polyimide pads 650 in the edge region may be separate one from the other, and thus, may avoid the unacceptable levels of IC chip-side warpage caused by heat-induced tensile stresses from a continuous polyimide layer during flip chip packaging.

Referring to FIG. 6, the method of making of making the portion of the flip chip package comprising a plurality of electrical connectors 685 may include forming electrical connectors 685 above the first polyimide pads 650 in the mid-radial region and the second polyimide pads 660 stacked atop the first polyimide pads 650 in the edge region that are covered by the RDL. Each electrical connector of the plurality of electrical connectors 685 may be of a same height and may be disposed on the upper surface contact of one of the conductive traces 670. Each electrical connector 685 may comprise one of a solder bump and a copper (Cu) pillar. A relative height of each electrical connector 685 may be equal to the first pad height of a first polyimide pad 650 plus the second pad height of a second polyimide pad 660 for each stacked pad underlying each electrical connector 685 in the edge region, and may be equal to the first pad height for each first polyimide pad 650 underlying each electrical connector 685 in the mid-radial region of the IC chip.

The method of making the flip chip package comprising the IC chip, the RDL, and the electrical connectors 685 may include flipping the IC chip, on which the RDL and the electrical connectors 685 are formed, and heating solder joins between the electrical connectors 685, which are disposed on a warped flipped IC chip, and flip chip attaches, which are disposed on a warped chip carrier, to form the flip chip package (See FIGS. 1, 2 and 5).

The method of forming the RDL may also include forming a plurality of conductive liners, 620, 630, 640 in the central, mid-radial and edge regions, respectively. Each conductive liner may contact the final wiring level 610 through one of the first, second, and third pluralities of openings in passivation layer 610, and may extend to the upper surface contact under each conductive trace 670. Each conductive line may comprise a metal or metal alloy including any of titanium (Ti), tungsten (W), tantalum (Ta), nickel (Ni), chromium (Cr), zinc (Zn), silver, (Ag), and gold (Au).

The method of making the flip chip package comprising the RDL may further include forming a final polyimide passivation layer 690 on the RDL of the IC chip before the forming of the electrical connectors 685, and subsequently etching the final polyimide passivation layer 690 to form a plurality of openings that expose the upper surface contacts of each of the conductive traces 670. After the etching of the openings in the final passivation layer 690 and before the forming of the plurality of electrical connectors 685, a plurality of ball limiting metallurgy (BLM) structures may be formed on the upper surface contacts exposed by the plurality of openings of the final polyimide passivation layer 690. Each of the BLM structures may comprise one of more layers, where any of the one or more layers may comprise a metal or metal ally including any of nickel (Ni), chromium (Cr), zinc (Zn), silver, (Ag), and gold (Au).

Figure 7:
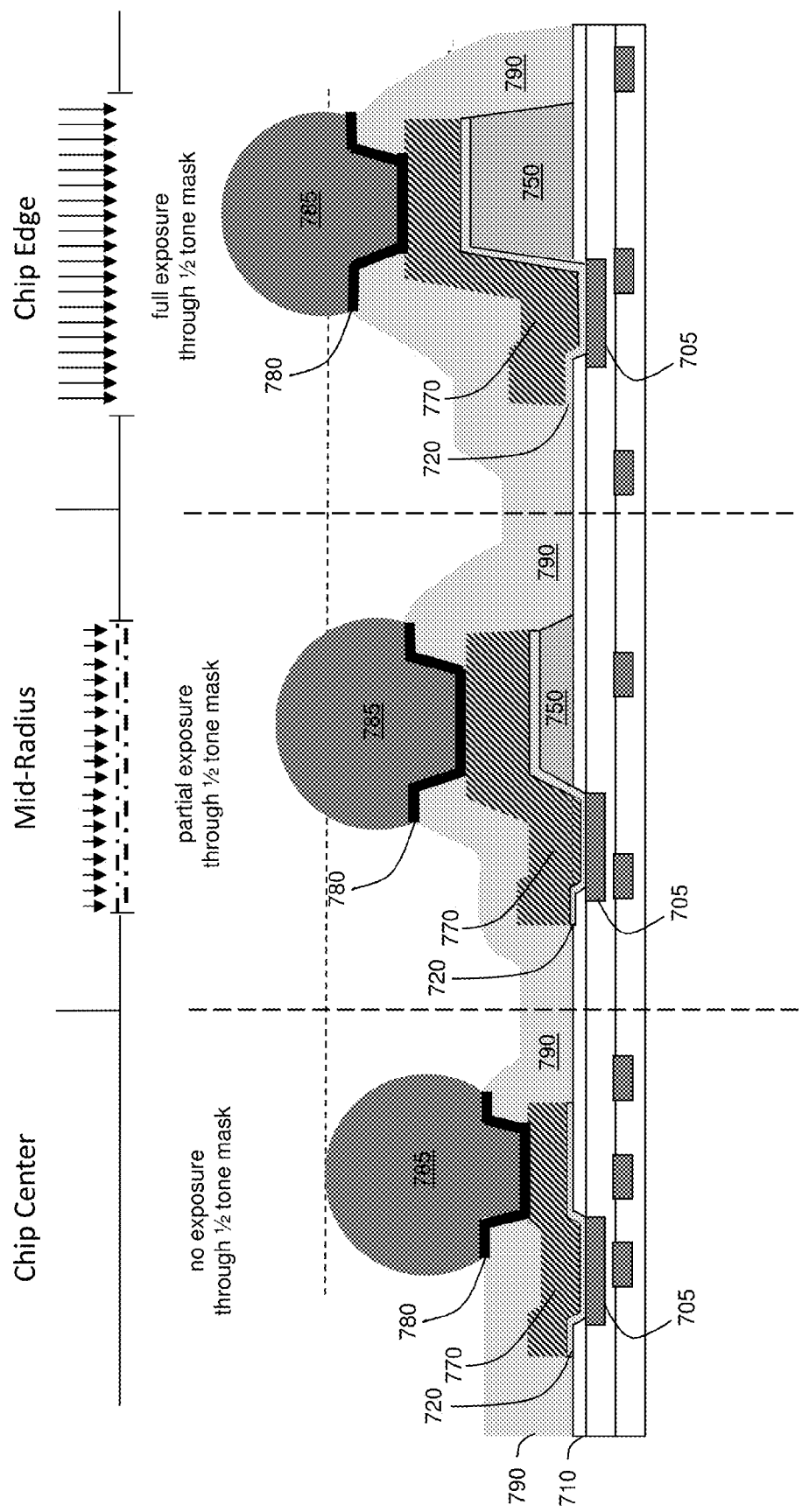
FIG. 7 illustrates a schematic cross section of an IC chip, a chip-side RDL and electrical connectors disposed on the RDL, in which polyimide pads may continuously increase in height as they approach the edges and corners of the IC chip in a flip chip package of an exemplary embodiment.

FIG. 7 illustrates a schematic cross section of a portion of a flip chip package comprising an IC chip, a chip-side redistribution layer (RDL), and electrical connectors 785, in which polyimide pads 750, formed on a passivation layer 710 of the IC chip, may continuously increase in height as they approach edges of the IC chip, to compensate for gaps caused by warpage during heating in the making of a flip chip package. A radial distance from a central neutral point of the IC chip may delineate three regions of the IC chip including: an edge region that centripetally extends from edges and corners of the IC chip to an inner radius, $R_2$, a central region that centrifugally extends from the central point to a radius, $R_1$, where $R_1 < R_2$, and a mid-radial region interposed between the central region and the edge region. The height of the polyimide pads 750 may continuously vary across the radius of the IC chip by using a continuously-varying radial density of a half-tone mask to determine the amount of deposition exposure for each polyimide pad 50, such that, little or no polyimide is deposited on the central portion of the passivation layer 710, while a mid-radial portion of the passivation layer 710 receives a partial exposure for deposition of a polyimide pad 750, and an edge-disposed portion of the passivation layer 710 receives a full exposure for deposition of a polyimide pad 750.

Referring to FIG. 7, a method of making a flip chip package may include forming, with a patterned and continuously-varying radial half-tone mask, a plurality of polyimide (PI) pads 750 on a passivation layer 710 of an integrated circuit (IC) chip, where each of the polyimide pads 750 may be associated with one of a plurality of openings in the passivation layer 710 to an inner wiring level in the IC chip. Each of the polyimide pads' heights may be determined by an exposure through the patterned and continuously-varying radial half-tone mask and may be correlated with a radial distance from a central neutral point on the IC chip.

Each of the polyimide pads 750 may possess mechanical properties that "cushion" the underlying IC chip from mechanical forces produced by chip join processes in the making of the flip chip package. Each of the polyimide pads 750 in the mid-radial region and in the edge region may be separate one from the other, and thus, may avoid the unacceptable levels of IC chip-side warpage caused by heat-induced tensile stresses from a continuous polyimide layer during flip chip packaging.

The method of making of making the portion of the flip chip package comprising the RDL may include forming the RDL on the passivation layer 710 and on the polyimide pads 750. The RDL may include a plurality of conductive traces 770 that re-distribute electrical signals or voltages from portions of the final wiring level 705 of the IC chip for compatibility with different packaging options, e.g., one of variously patterned chip carriers for a flip chip package. Each conductive trace 770 may comprise a metal, e.g., aluminum (Al). Each conductive trace 770 may extend from a lower surface contact proximate to a portion of the final wiring level 705 through a one of the plurality of openings in the central region, the mid-radial region, and the edge region of the passivation layer 710, to an upper surface contact formed above one of: the passivation layer 710 in the central region, which is devoid of the polyimide pads 750, and the polyimide pads 750 in the mid-radial and edge regions. In various exemplary embodiments, each conductive trace 770 may extend from the lower surface contact proximate to a portion of the final wiring level 705 in any of the central, mid-radial, and edge regions of the IC chip, through a single opening in the passivation layer 710, to be disposed on any of: the passivation layer 710 in the central region and the polyimide pads 750 in the mid-radial and edge regions of the IC chip.

Referring to FIG. 7, the method of making of making the portion of the flip chip package comprising a plurality of electrical connectors 785 may include forming electrical connectors 785 above the passivation layer 710 in the central region and the polyimide pads 750 in the mid-radial and the edge regions that are covered by the RDL. Each electrical connector of the plurality of electrical connectors 785 may be of a same height and may be disposed on the upper surface contact of one of the conductive traces 770. Each electrical connector 785 may comprise one of a solder bump and a copper (Cu) pillar. A relative height of each electrical connector 785 may be determined from an electrical connector 785 disposed in the central region of the IC chip. Each electrical connector 785 may be of a same height and may be disposed over the upper surface contact of each conductive trace 770.

The method of making the flip chip package comprising the IC chip, the RDL, and the electrical connectors 785 may include flipping the IC chip, on which the RDL and the electrical connectors 785 are formed, and heating solder joins between the electrical connectors 785, which are disposed on a warped flipped IC chip, and flip chip attaches, which are disposed on a warped chip carrier, to form the flip chip package (See FIGS. 1, 2 and 5).

The method of forming the RDL may also include forming a plurality of conductive liners, 720, 730, 740 in the central, mid-radial and edge regions, respectively. Each conductive liner may contact the final wiring level 710 through one of the openings in passivation layer 710, and may extend to the upper surface contact under each conductive trace 770. Each conductive line may comprise a metal or metal alloy including any of titanium (Ti), tungsten (W), tantalum (Ta), nickel (Ni), chromium (Cr), zinc (Zn), silver, (Ag), and gold (Au).

The method of making the flip chip package comprising the RDL may further include forming a final polyimide passivation layer 790 on the RDL of the IC chip before the forming of the electrical connectors 785, and subsequently etching the final polyimide passivation layer 790 to form a plurality of openings that expose the upper surface contacts of each of the conductive traces 770. After the etching of the openings in the final passivation layer 790 and before the forming of the plurality of electrical connectors 785, a plurality of ball limiting metallurgy (BLM) structures may be formed on the upper surface contacts exposed by the plurality of openings of the final polyimide passivation layer 790. Each of the BLM structures may comprise one of more layers, where any of the one or more layers may comprise a metal or metal ally including any of nickel (Ni), chromium (Cr), zinc (Zn), silver, (Ag), and gold (Au).

Figure 8:
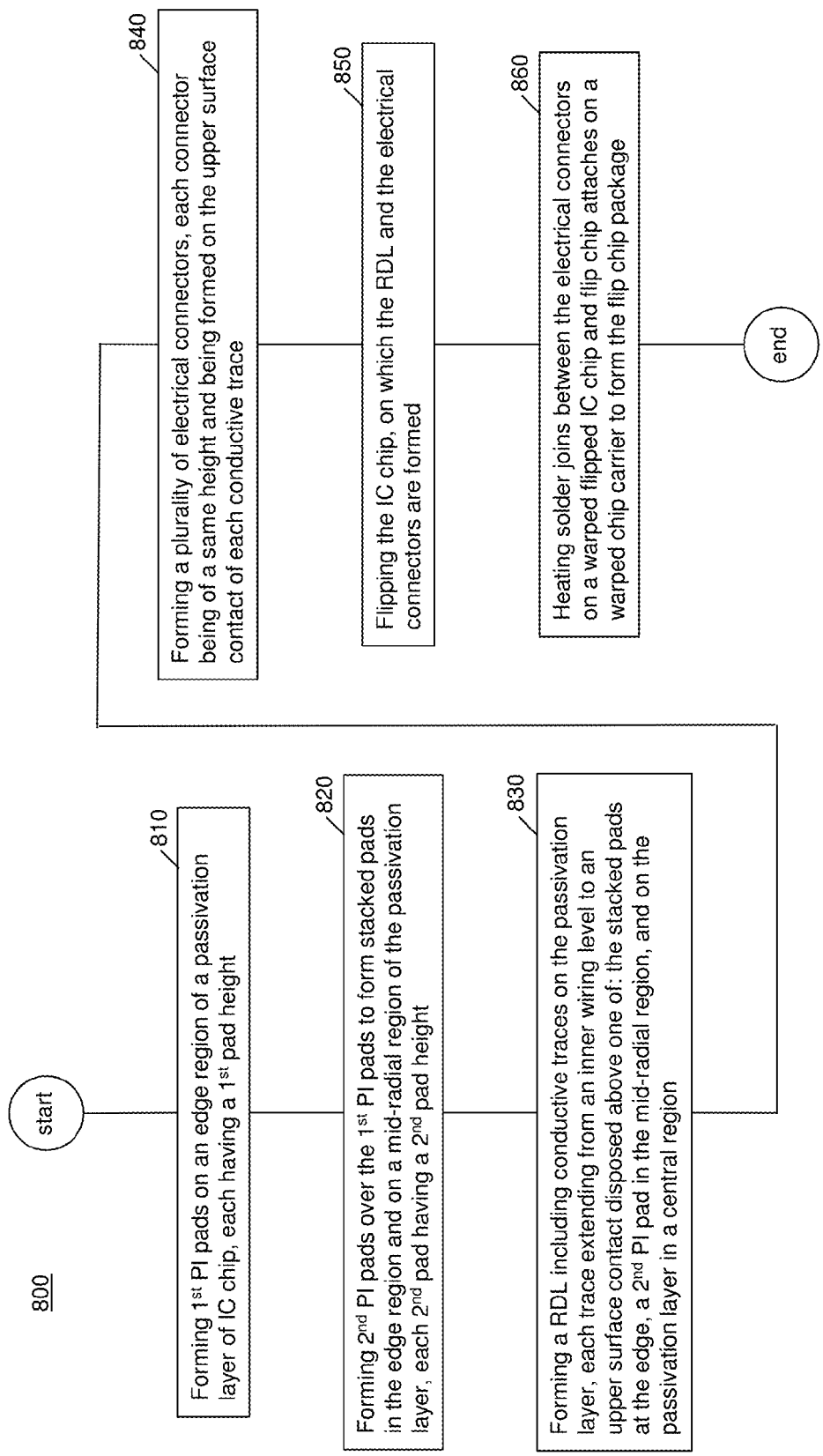
FIG. 8 is a flowchart 800 illustrating a method of making a flip chip package for an IC chip, in which polyimide pads of a varying height comprise one of: a second polyimide pad, and a second polyimide pad formed on a first polyimide pad, as shown in FIG. 5, in the flip chip package of an exemplary embodiment.

Referring to FIG. 8, a flowchart 800 illustrates an exemplary embodiment of a method of making a flip chip package, as shown in FIG. 5, above. The method may include forming a plurality of first PI pads, each having a first pad height, on an edge region of a passivation layer of an IC chip, where each first PI pad may be associated with one of a first plurality of openings in the passivation layer to an inner final wiring level of the IC chip, 810. The method may also include forming a second plurality of second PI pads, each having a second pad height, a second PI pad from a portion of the second PI pads may be stacked on each of the first PI pads to form a stacked pad equal to the first pad height plus the second pad height in the edge region, a second PI pad from another portion of the second PI pads may be formed on a mid-radial region of the passivation layer and may be associated with one of a second plurality of openings in the passivation layer to the final wiring level, 820. The method may further include forming an RDL that includes a plurality of conductive traces, where each conductive trace may extend from a lower surface contact proximate to the final wiring level through one of the first plurality, the second plurality, and a third plurality of openings in the passivation layer to an upper surface contact disposed above one of: the second PI pads disposed atop each stacked pad in the edge region, one of the second PI pads in the mid-radial region, and the passivation layer in a central region, which is devoid of the first and second PI pads, 830. The method may yet further include forming a plurality of electrical connectors, where each electrical connector may be of a same height and may be disposed over the upper surface contact of each conductive trace, 840. The method may yet further include flipping the IC chip, on which the RDL and the electrical connectors are formed, 850. Finally, the method may include heating solder joins between the electrical connectors, which are disposed on a warped flipped IC chip, and flip chip attaches, which are disposed on a warped chip carrier, to form the flip chip package, 860.

Figure 9:
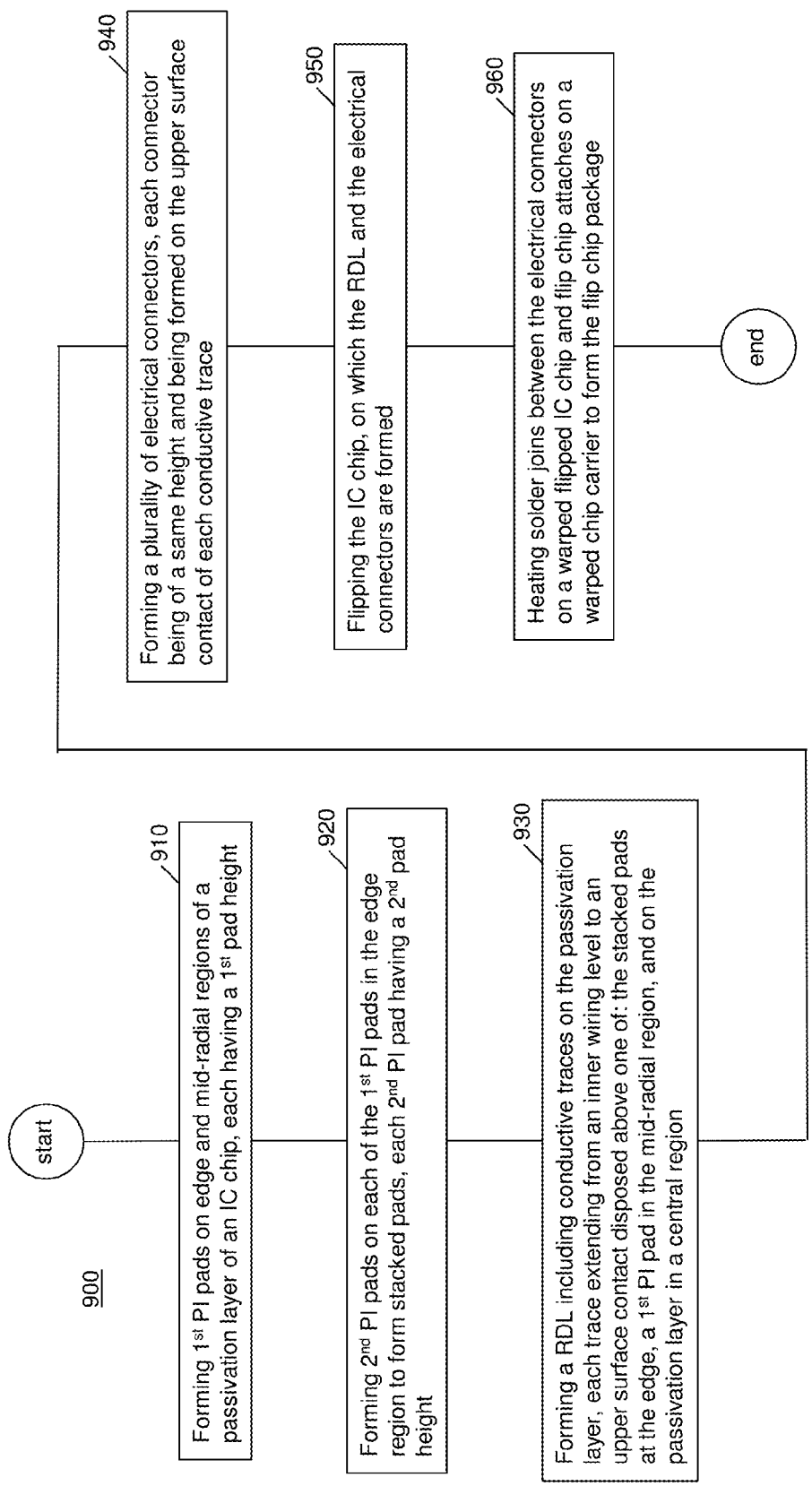
FIG. 9 is a flowchart 900 illustrating a method of making a flip chip package for an IC chip, in which polyimide pads of a varying height comprise one of: a first polyimide pad, and a second polyimide pad formed on a first polyimide pad, as shown in FIG. 6, in a flip chip package of an exemplary embodiment.

Referring to FIG. 9, a flowchart 900 illustrates an exemplary embodiment of a method of making a flip chip package, as shown in FIG. 6, above. The method may include forming a plurality of first polyimide (PI) pads on a passivation layer of an integrated circuit (IC) chip, each of the first PI pads having a first pad height, where each of a portion of the first PI pads may be formed on an edge region of the passivation layer and may be associated with one of a first plurality of openings in the passivation layer to an inner final wiring level of the IC chip, and where each of another portion of the first PI pads may be formed on a mid-radial region of the passivation layer and may be associated with one of a second plurality of openings in the passivation layer to the final wiring level, 910. The method may also include forming a second plurality of second PI pads, each having a second pad height, on each of the first PI pads in the edge region to form a stacked pad equal to the first pad height and the second pad height, 920. The method may further include forming a redistribution layer (RDL) that includes a plurality of conductive traces, where each conductive trace may extend from a lower surface contact proximate to the final wiring level through one of the first plurality, the second plurality, and a third plurality of openings in the passivation layer to an upper surface contact disposed above one of the second PI pads formed atop each stacked pad in the edge region, on one of the first PI pads in the mid-radial region, and on the passivation layer in a central region, which is devoid of first and second PI pads, 930. The method may yet further include forming a plurality of electrical connectors, where each electrical connector may be of a same height and may disposed over the upper surface contact of each conductive trace, 940. The method may yet further include flipping the IC chip, on which the RDL and the electrical connectors are formed, 950. Finally, the method may include heating solder joins between the electrical connectors, which are disposed on a warped flipped IC chip, and flip chip attaches, which are disposed on a warped chip carrier, to form the flip chip package, 960.

Figure 10:
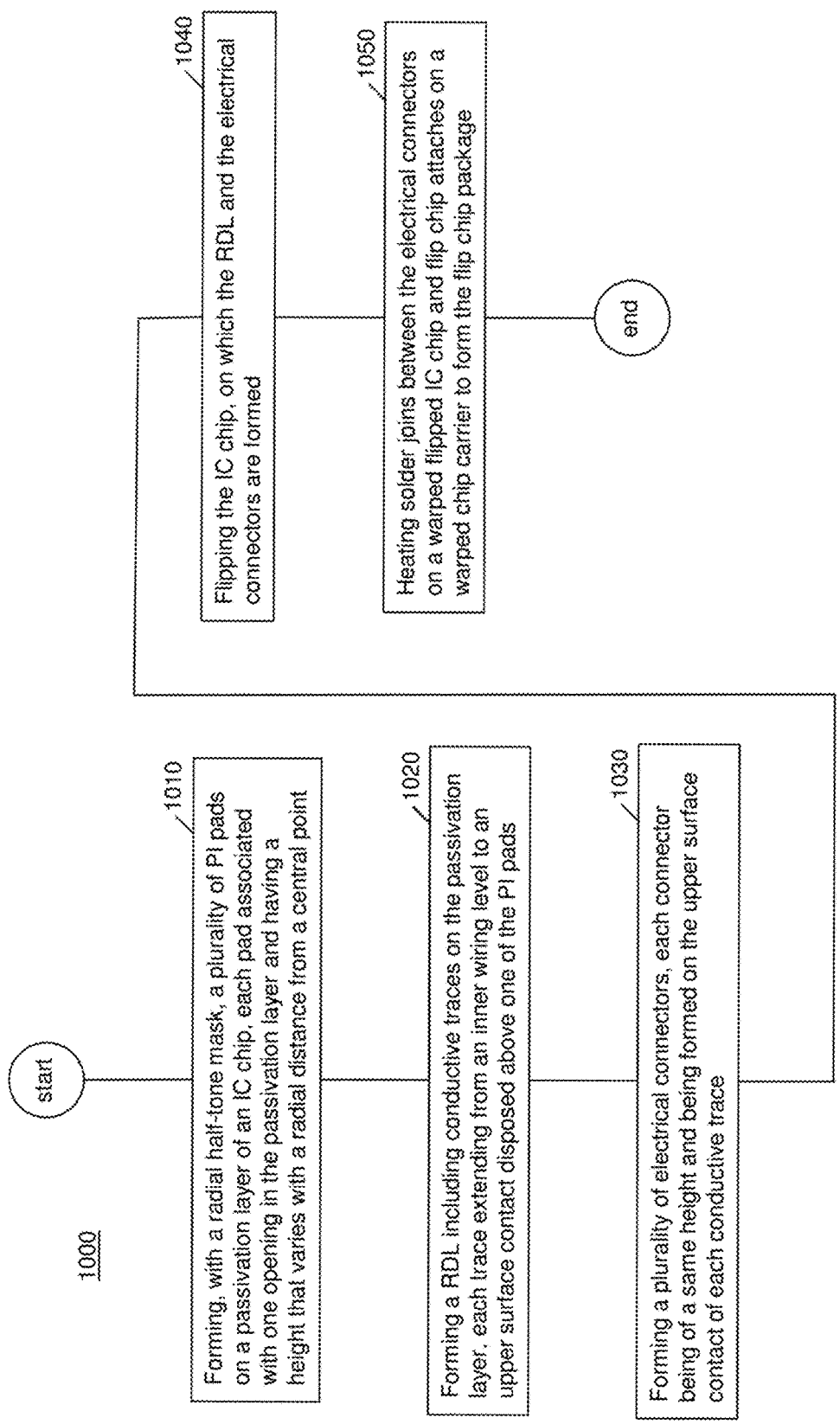
FIG. 10 is a flowchart 1000 illustrating a method of making a flip chip package for an IC chip, in which polyimide pads may continuously increase in height as they approach edges and corners of the IC chip, as shown in FIG. 4, in a flip chip package of an exemplary embodiment.

Referring to FIG. 10, a flowchart 1000 illustrates an exemplary embodiment of a method of making a flip chip package, as shown in FIG. 7, above. The method may include forming, with a patterned and continuously-varying radial half-tone mask, a plurality of polyimide (PI) pads on a passivation layer of an integrated circuit (IC) chip, where each of the PI pads may be associated with one of a plurality of openings in a passivation layer to an inner wiring level in the IC chip, and where each of the PI pads' heights may be determined by an exposure through the patterned and continuously-varying radial half-tone mask and may be correlated with a radial distance from a central neutral point on the IC chip, 1010. The method may also include forming a redistribution layer (RDL) over the PI pads, in which the RDL may contain a plurality of conductive traces, where each conductive trace may extend from a lower surface contact proximate to the final wiring level through one opening of the plurality of openings in the passivation layer to an upper surface contact that overlies one of the PI pads, 1020. The method may further include forming a plurality of electrical connectors, where each electrical connector may be of a same height and may be disposed over the upper surface contact of each conductive trace, 1030. The method may yet further include flipping the IC chip, on which the RDL and the electrical connectors are formed, 1040. Finally, the method may include heating solder joins between the electrical connectors, which are disposed on a warped flipped IC chip, and flip chip attaches, which are disposed on a warped chip carrier, to form the flip chip package, 1050.

In the packaging, the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A flip chip package, comprising:
   a flipped integrated circuit (IC) chip including a passivation layer containing a plurality of openings to an inner final wiring level;
   a plurality of polyimide (PI) pads disposed on said passivation layer, each PI pad corresponding to a single opening in said passivation layer and having a variable pad height that increases with a radial distance from a central neutral point (DNP) on said flipped IC chip;
   a redistribution layer (RDL) disposed on said passivation layer and said plurality of PI pads, said RDL including a plurality of conductive traces, each conductive trace extending from a lower surface contact proximate to said final wiring level through said single opening to an upper surface contact disposed above a PI pad of said plurality of PI pads;
   a plurality of electrical connectors, each electrical connector having a same height and being disposed over said upper surface contact of said each conductive trace; and
   a chip carrier opposing said flipped IC chip, said chip carrier including a plurality of flip chip attaches, each flip chip attach having a solder join to a corresponding one of said plurality of electrical connectors on said flipped IC chip.

2. The flip chip package of claim 1, a relative height of each electrical connector from said passivation layer being equal to said variable pad height for said each PI pad disposed under said each electrical connector.

3. The flip chip package of claim 1, further comprising:
   a plurality of conductive liners, each conductive liner being disposed under said each conductive trace;
   a plurality of ball limiting metallurgy (BLM) structures, each BLM structure being disposed on said upper surface contact of said each conductive trace; and
   a final polyimide (PI) passivation layer disposed on portions of said passivation layer, on portions of said conductive traces that are not covered by said BLM structures, and on portions of said BLM structures that are not covered by said electrical connectors.

4. The flip chip package of claim 1, each of said electrical connectors comprising one of a solder bump and a copper (Cu) pillar.

5. The flip chip package of claim 1, said radial distance from said DNP delineating three regions of said flipped IC chip including: an edge region centripetally extending from edges and corners of said flipped IC chip to an inner radius, $R_2$; a central region centrifugally extending from said central neutral point to a radius, $R_1$, of said flipped IC chip, where $R_1 < R_2$; and a mid-radial region of said flipped IC chip interposed between said central region and said edge region.

6. The flip chip package of claim 5, each of a first portion of said plurality of PI pads having a first pad height and being disposed on said edge region; each of a second portion of said plurality of PI pads having a second pad height and being disposed on said mid-radial region; each of a third portion of said plurality of PI pads having a third pad height and being disposed on said central region; and said first pad height being greater than said second pad height, which is greater than said third pad height.

7. The flip chip package of claim 6, said first pad height preferably ranging from 6 to 12 μm; said second pad height preferably ranging from 3 to 8 μm; and said third pad height preferably ranging from 1 to 4 μm.

8. The flip chip package of claim 5, said central region being devoid of said PI pads; each of a first portion of said plurality of PI pads having a first pad height and being disposed on said edge region; each of a second portion of said plurality of PI pads having a second pad height and being disposed on said mid-radial region; and said first pad height being greater than said second pad height.

9. The flip chip package of claim 8, said first pad height preferably ranging from 6 to 12 μm; and said second pad height preferably ranging from 3 to 8 μm.

10. A flip chip package, comprising:
a passivation layer disposed on a flipped integrated circuit (IC) chip, said passivation layer containing a plurality of openings to an inner final wiring level;
a plurality of polyimide (PI) pads disposed on said passivation layer, each PI pad corresponding to a single opening in said passivation layer and having a variable pad height that increases with a radial distance from a central neutral point (DNP) on said flipped IC chip;
a redistribution layer (RDL) disposed on said passivation layer and said PI pads, said RDL including a plurality of conductive traces, each conductive trace extending from a lower surface contact proximate to said final wiring level through said single opening to an upper surface contact disposed above a single PI pad;
a plurality of ball limiting metallurgy (BLM) structures, each BLM structure disposed on said upper surface contact of said each conductive trace of said RDL;
a plurality of electrical connectors, each electrical connector having a same height and being disposed on one of said BLM structures;
a final polyimide (PI) passivation layer disposed on portions of said passivation layer and on portions of said plurality of conductive traces not covered by said BLM structures; and
a chip carrier opposing said flipped IC chip, said chip carrier including a plurality of flip chip attaches, each flip chip attach having a solder join to a corresponding one of said plurality of electrical connectors on said flipped IC chip.

11. The flip chip package of claim 10, a relative height of each electrical connector from said passivation layer being equal to said variable pad height for said each PI pad disposed under said each electrical connector.

12. The flip chip package of claim 10, further comprising a plurality of conductive liners, each conductive liner being disposed under said each conductive trace.

13. The flip chip package of claim 10, each of said electrical connectors comprising one of a solder bump and a copper (Cu) pillar.

14. The flip chip package of claim 10, said radial distance from said DNP delineating three regions of said flipped IC chip including: an edge region centripetally extending from edges and corners of said flipped IC chip to an inner radius, $R_2$; a central region centrifugally extending from said central neutral point to a radius, $R_1$, of said flipped IC chip, where $R_1 < R_2$;
and a mid-radial region of said flipped IC chip interposed between said central region and said edge region.

15. The flip chip package of claim 14, each of a first portion of said plurality of PI pads having a first pad height and being disposed on said edge region; each of a second portion of said plurality of PI pads having a second pad height and being disposed on said mid-radial region; each of a third portion of said plurality of PI pads having a third pad height and being disposed on said central region; and said first pad height being greater than said second pad height, which is greater than said third pad height.

16. The flip chip package of claim 15, said first pad height preferably ranging from 6 to 12 μm; said second pad height preferably ranging from 3 to 8 μm; and said third pad height preferably ranging from 1 to 4 μm.

17. The flip chip package of claim 14, said central region being devoid of said PI pads; each of a first portion of said plurality of PI pads having a first pad height and being disposed on said edge region; each of a second portion of said plurality of PI pads having a second pad height and being disposed on said mid-radial region; and said first pad height being greater than said second pad height.

18. The flip chip package of claim 17, said first pad height preferably ranging from 6 to 12 μm; and said second pad height preferably ranging from 3 to 8 μm.

\* \* \* \* \*